United States Patent
Abiru et al.

(10) Patent No.: US 9,780,592 B2
(45) Date of Patent: Oct. 3, 2017

(54) BATTERY PACK FOR SELECTIVELY SETTING A HIGH CAPACITY MODE HAVING A HIGH CHARGE CAPACITY UNTIL A FULL CHARGE OF A SECONDARY BATTERY

(71) Applicant: SANYO Electric Co., Ltd., Osaka (JP)

(72) Inventors: Kensuke Abiru, Hyogo (JP); Hisanori Amasaki, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 97 days.

(21) Appl. No.: 14/778,587

(22) PCT Filed: Sep. 8, 2014

(86) PCT No.: PCT/JP2014/004592
§ 371 (c)(1),
(2) Date: Sep. 19, 2015

(87) PCT Pub. No.: WO2015/079607
PCT Pub. Date: Jun. 4, 2015

(65) Prior Publication Data
US 2016/0197506 A1    Jul. 7, 2016

(30) Foreign Application Priority Data
Nov. 29, 2013    (JP) ................. 2013-247138

(51) Int. Cl.
*H02J 7/00* (2006.01)
*G01R 31/36* (2006.01)
(Continued)

(52) U.S. Cl.
CPC ........ *H02J 7/0068* (2013.01); *G01R 31/3655* (2013.01); *H01M 10/46* (2013.01);
(Continued)

(58) Field of Classification Search
CPC .......... G01R 31/3655; G01R 31/3679; H01M 10/0525; H01M 10/44; H01M 10/46;
(Continued)

(56) References Cited

U.S. PATENT DOCUMENTS 5,631,533 A * 5/1997 Imaseki ................ H02J 7/0016
                                                320/118
2002/0060554 A1* 5/2002 Odaohhara ........... H02J 7/0073
                                                320/134

(Continued)

FOREIGN PATENT DOCUMENTS

CN    102097835    6/2011
JP    7-255133    10/1995
(Continued)

OTHER PUBLICATIONS

English translation of Search Report dated Aug. 15, 2016 in Chinese Application No. 201480002221.0.

(Continued)

*Primary Examiner* — Nathaniel Pelton
(74) *Attorney, Agent, or Firm* — Wenderoth, Lind & Ponack, L.L.P.

(57) ABSTRACT

A controlling and computing portion for controlling charge or discharge of a secondary battery comprises an operation mode setting portion for selectively setting a high capacity mode using a first voltage or a long life mode using a second voltage lower than the first voltage, a remaining capacity calculating portion for calculating a relative state of charge from a remaining capacity of the secondary battery and a full charge capacity, a cycle number calculating portion for calculating a cycle number from a calculation result of the remaining capacity calculating portion, and a charge end voltage setting portion for decreasing the first voltage based on the cycle number, and setting the second voltage at a voltage left by subtracting a predetermined voltage from the (Continued)

first voltage in a case where the first voltage becomes equal to or less than a voltage obtained by adding a predetermined value to the second voltage.

6 Claims, 8 Drawing Sheets

(51) Int. Cl.
*H01M 10/46* (2006.01)
*H01M 10/44* (2006.01)
*H01M 10/48* (2006.01)
*H02J 7/04* (2006.01)
*H01M 10/0525* (2010.01)

(52) U.S. Cl.
CPC ........ *H02J 7/0047* (2013.01); *G01R 31/3679* (2013.01); *H01M 10/0525* (2013.01); *H01M 10/44* (2013.01); *H01M 10/48* (2013.01); *H01M 2220/30* (2013.01); *H02J 7/045* (2013.01); *H02J 2007/005* (2013.01)

(58) Field of Classification Search
CPC ............... H01M 10/48; H01M 2220/30; H02J 2007/005; H02J 7/0047; H02J 7/0068; H02J 7/045

USPC ....................................................... 320/134
See application file for complete search history.

(56) References Cited

U.S. PATENT DOCUMENTS

| | | | |
|---|---|---|---|
| 2003/0052647 A1 | 3/2003 | Yoshida et al. | |
| 2011/0133697 A1* | 6/2011 | Matsuura | H02J 7/0021 |
| | | | 320/132 |

FOREIGN PATENT DOCUMENTS

| | | |
|---|---|---|
| JP | 2001-309568 | 11/2001 |
| JP | 2002-078222 | 3/2002 |
| JP | 2002-359008 | 12/2002 |
| JP | 2011-125108 | 6/2011 |

OTHER PUBLICATIONS

International Search Report of PCT application No. PCT/JP2014/004592 dated Sep. 30, 2014.

* cited by examiner

BATTERY PACK FOR SELECTIVELY SETTING A HIGH CAPACITY MODE HAVING A HIGH CHARGE CAPACITY UNTIL A FULL CHARGE OF A SECONDARY BATTERY

This application is a U.S. national stage application of the PCT international application No. PCT/JP2014/004592.

TECHNICAL FIELD

The present invention is related to a battery pack which can selectively set a high capacity mode having a high charge capacity until a full charge of a secondary battery, or a long life mode to increase a cycle life of the secondary battery. Especially, also in a case where a charge end voltage is decreased to consider a decrease of a full charge capacity by cycle properties, the battery pack can obtain a relative state of charge corresponding to any one of the operation modes.

BACKGROUND ART

A battery pack having a secondary battery and a controlling and computing portion for controlling charging and discharging of the secondary battery is widely used as a power supply portion attached to an electric device of a note-type personal computer (PC) or the like. The secondary battery of the battery pack used in the electric device is charged with an external power supply (commercial power supply) through a power supply portion of the electric device, and when the electric device is not connected to the external power supply, instead of the external power supply, the secondary battery supplies power to the electric device.

For example, properties of a lithium ion battery as the secondary battery, concretely a charge capacity and a cycle life widely change depending on charging voltages as shown in FIG. 7. When a charge end voltage for detecting charging end is set at a high value to charge the secondary battery (the lithium ion battery), the large charge capacity is obtained as shown in the properties of A in FIG. 7, but the cycle life is short. In contrast, when the charge end voltage is set at a low value to charge the secondary battery (the lithium ion battery), the charge capacity is decreased as shown in the properties of B in FIG. 7, but the cycle life is long.

By using such battery properties, it is thought that the battery pack is used selectively in the high capacity mode or the long life mode by changing the charge end voltage at charging time of the secondary battery (for example, refer to patent literature 1). Concretely, the charge end voltage of the secondary battery (the lithium ion battery) is set at 4.2 V/cell in the high capacity mode, and the charge end voltage of the secondary battery (the lithium ion battery) is set at 4.0 V/cell at the long life mode, and then the secondary battery is charged.

CITATION LIST

Patent Literature

Patent Literature 1: Japanese Laid-Open Patent Publication No. 2002-78222

SUMMARY OF THE INVENTION

It is important to appropriately detect the remaining capacity of the secondary battery when the above battery pack is used as the battery pack attached to the electric device. In the remaining capacity of the secondary battery, the full charge state of the secondary battery (the full charge capacity; FCC) is 100%, and the ratio of the remaining capacity to it is widely used as the relative state of charge (RSOC).

In the above battery pack which is used selectively in the high capacity mode or the long life mode, when the high capacity mode is set, the design capacity (DC)(nominal capacity) of the secondary battery or the full charge capacity (FCC) is used as the maximum charge capacity (100%). When the long cycle mode is set, the ratio of 100% or less to the design capacity (DC) of the secondary battery or the full charge capacity (FCC), for example, 80% is used as the maximum charge capacity. Therefore, as shown in FIG. 8, the charge end voltage in the high capacity mode is set at 4.2 V/cell, and the charge end voltage in the long cycle mode is set at 4.0 V/cell.

However, in the high capacity mode, even after the secondary battery (the lithium ion battery) is degraded due to a large cycle number, when the charge end voltage is set continuously at 4.2 V, the secondary battery is over-charged, and then its degradation is progressed.

The present disclosure is developed for the purpose of solving such problems. One non-limiting and explanatory embodiment provides a battery pack where while it is suppressed that a secondary battery used selectively at the high capacity mode or the long life mode is degraded by over-charge, a relative state of charge of the secondary battery is appropriately obtained corresponding to the operation mode (charging mode) even at a time of changing the operation modes.

A battery pack of the present disclosure comprises a secondary battery, and a controlling and computing portion for controlling charging and discharging of the secondary battery. Further the controlling and computing portion comprises an operation mode setting portion for selectively setting a high capacity mode or a long life mode. The high capacity mode restricts charge end voltage of the secondary battery within a first voltage, and the long life mode restricts the charge end voltage of the secondary battery within a second voltage lower than the first voltage to increase a cycle life of the secondary battery. In addition, the controlling and computing portion comprises a remaining capacity calculating portion for calculating a relative state of charge from a remaining capacity and a full charge capacity, and the remaining capacity is calculated based on a discharging current and a discharging time of the secondary battery, or the discharging current and a battery voltage. Moreover, the controlling and computing portion comprises a cycle number calculating portion for calculating a cycle number from a calculation result of the remaining capacity calculating portion, and a charge end voltage setting portion for decreasing the first voltage based on the cycle number, and setting the second voltage at a voltage left by subtracting a predetermined voltage from the first voltage in a case where the first voltage becomes equal to or less than a voltage obtained by adding a predetermined value to the second voltage.

Accordingly, as the charge end voltage becomes suitable for the cycle properties of the secondary battery, the degradation of the secondary battery by over-charge can be prevented.

In the battery pack of the above configuration, while it is suppressed that the secondary battery used selectively in the high capacity mode or the long life mode is degraded by over-charge, the relative state of charge of the secondary battery is appropriately obtained corresponding to the operation mode even at a time of changing the operation modes.

DESCRIPTION OF EMBODIMENTS

A battery pack related to one embodiment of the present invention is explained below, referring the figures.

Figure 1:
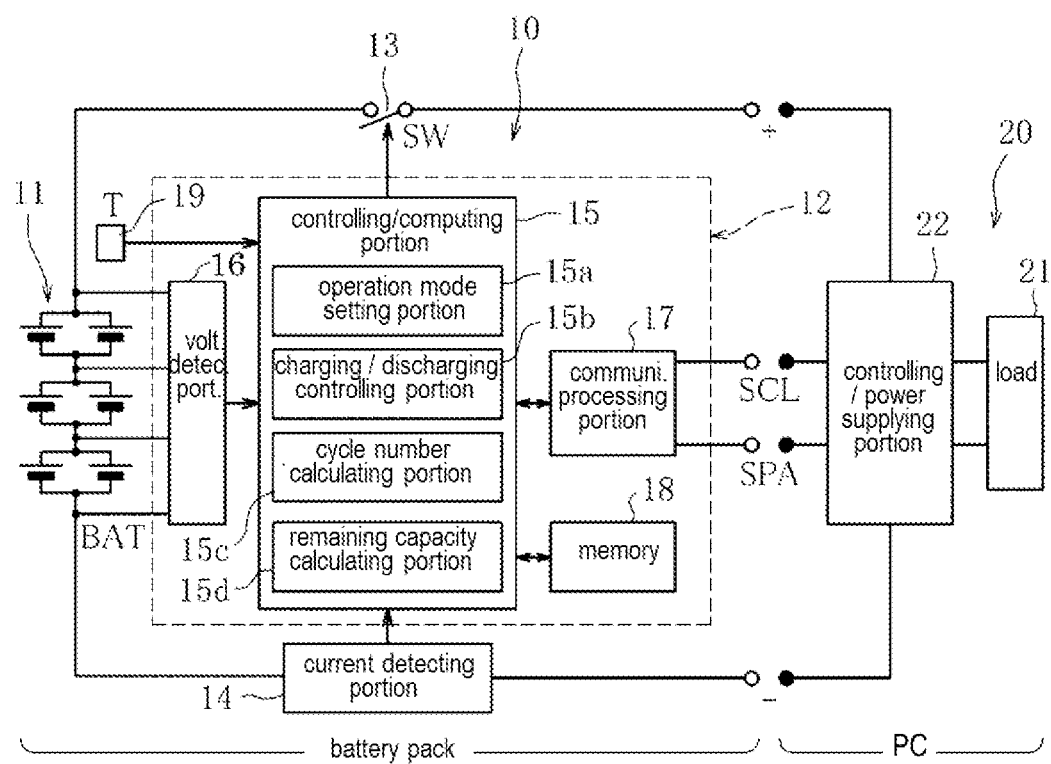
FIG. 1 is a configuration diagram of a battery pack related to one embodiment of the present invention.

FIG. 1 is a configuration diagram of a battery pack related to one embodiment of the present invention. Battery pack 10 is detachably attached to electric device 20 of a note-type personal computer (PC) or the like. Fundamentally, battery pack 10 comprises secondary battery (BAT) 11, and controlling portion 12 for controlling charging and discharging of secondary battery 11, and is attached to electric device 20 for using.

Concretely, secondary battery 11 in battery pack 10 comprises, for example, a two-piece pair each of plural battery cells of lithium ion batteries (about 2600 mAh/cell) is connected in parallel, and three pairs of these parallel-connected battery cells are connected in series. This is, so-called, a 3-series and 2-parallel type. Here, the 3-series and 2-parallel type of secondary battery 11 is explained as one example, but the number of the parallel-connected battery cells and the number of the series-connected battery cells may be determined according to the rated output voltage and the rated output current capacity as the battery specification.

In the charging and discharging path of secondary battery 11 in battery pack 10, switching element 13 of a FET or the like for controlling charge or discharge of it is inserted in series, and a shunt resistor of current detecting portion 14 for detecting charge or discharge current is inserted in series. Controlling portion 12 provided in battery pack 10 is, for example, a micro-processor unit (MPU). Controlling portion 12 comprises controlling and computing portion 15 configuring its main portion, voltage detecting portion 16 for detecting terminal voltages of secondary battery 11, concretely the terminal voltages in each of the battery cells (cell voltages), and communication processing portion 17 for communicating with electric device 20.

Controlling and computing portion 15 monitors charge and discharge state based on temperature of secondary battery 11 (battery temperature) detected by temperature detecting element 19 of a thermistor or the like, the cell voltages detected by voltage detecting portion 16, and charge and discharge current detected by current detecting portion 14. Controlling and computing portion 15 carries out the ON/OFF control of switching element 13 in order to protect secondary battery 11 from abnormal charge or discharge, and controls charging voltage or charging current by transmitting control order to electric device 20 side through communicating portion 17.

Fundamentally, electric device 20 includes controlling and power supplying portion 22. It receives external power (not shown; commercial power supply), and drives load 21 as a main portion of electric device 20, and also supplies power to battery pack 10 to charge above-described secondary battery 11. For example, when the external power is not supplied, controlling and power supplying portion 22 drives load 21 by power supplied from secondary battery 11 of battery pack 10. In a case where secondary battery 11 is a lithium ion battery, controlling and power supplying portion 22 charges secondary battery 11 with constant current or constant voltage while restricting current within a maximum current (about 0.5 to 4 C) or voltage within a maximum voltage (about 4.2 V/cell).

Here, controlling and power supplying portion 22 has a communication function, for example, by the SMBUS method through the data line SDA and the clock line SCL between power supplying portion 22 and communication processing portion 17. Controlling portion 12 of battery pack 12 controls operation of controlling and power supplying portion 22, and variably sets charge voltage or charge current of secondary battery 11 by controlling and power supplying portion 22. By control of this controlling and power supply portion 22, the charging to secondary battery 11 is controlled.

Controlling and computing portion 15 realized by the microprocessor includes, for example, operation mode setting portion 15$a$, charging and discharging controlling portion 15$b$, cycle number calculating portion 15$c$, and remaining capacity calculating portion 15$d$, by executing software program stored in memory 18 in advance. Here, besides the above configuration, controlling and computing portion 15 has various functions for safety of battery pack 10, for example, a full charge detecting portion, a monitoring portion for monitoring troubles or abnormal states, a performance (life) determining portion, and the like. Such functions are not directly related to the point of the present invention, and then their explanations are omitted.

Operation mode setting portion 15$a$ detects a state of a mode changing switch (not shown) provided in battery pack 10, or receives selection order in the operation mode transmitted from electric device 20 side, and then selects and sets an applied operation mode of secondary battery 11, for example, a high capacity mode or a long life mode.

In a case where secondary battery 11 is a lithium ion battery, in the high capacity mode, secondary battery 11 is charged while the charging is restricting the charge end voltage of secondary battery 11 within a first voltage to be a full charge capacity (for example, 4.2 V/cell), and a charge capacity of secondary battery 11 is adequately enhanced.

Secondary battery 11 becomes a full charge capacity at the charge end voltage. Further, in the long life mode, secondary battery 11 is charged while the charging is restricting the charge end voltage within a second voltage (for example, 4.0V/cell) lower than the first voltage, and by avoiding charging in the range close to the full charge, this mode makes time length of repeated charging and discharging, so-called, the cycle life, longer while the charge capacity is restricted to a certain low level. The second voltage is suitable for 3.9 to 4.1 V/cell to prevent over-charge and to obtain a capacity to a certain degree.

Secondary battery 11 is charged with, so-called, constant current and constant voltage charge restricting charging current and charging voltage as mentioned above. Concretely, when secondary battery 11 where the lithium ion battery cells are connected in 3-series and 2-parallel is used, for example, the constant current and constant voltage charge is carried out by using a power supply device of the constant current and constant voltage charge providing the maximum output current of 5000 mA and the maximum output voltage of 4.2 V/cell. The first voltage and the second voltage mentioned above are the voltages within which charge end voltages of secondary battery 11 are restricted in this constant current and constant voltage charging.

Charging and discharging controlling portion 15b in controlling and computing portion 15 controls the charging to secondary battery 11 by restricting the charge end voltage, or the discharging of secondary battery 11 by restricting the maximum discharging current under the above-mentioned restricting condition. Cycle number calculating portion 15c monitors number of cycles in the charging of secondary battery 11 under the above-mentioned charging control, and calculates the number of cycles (the cycle number), for example, by using a value of integrated discharge capacity divided by the full charge capacity, or a number in which the remaining capacity of secondary battery 11 becomes equal to or less than a predetermined capacity close to the value at which secondary battery 11 cannot discharge. Here, the example in which the number of cycles is calculated as the value of integrated discharge capacity divided by the full charge capacity, is explained. However, the number of cycles is not limited to this. A value which can estimate the frequency of use for secondary battery 11, can be used as the number of cycles.

Fundamentally, remaining capacity calculating portion 15d in controlling and computing portion 15 Integrates power value ($\Delta W$; unit [AV] or [W]) of the product of charging and discharging current value of secondary battery 11 detected at current detecting portion 14 multiplied by voltage value, or value ($\Delta I$; unit [mAh]) of the product of charging and discharging current value multiplied by current flowing time to calculate its charge capacity (CC; Charge Capacity) or its discharge capacity (DCC; Discharge Capacity). Further, remaining capacity calculating portion 15d calculates the ratio of the remaining capacity (RC; Remaining Capacity) to the full charge capacity (FCC; Full Charge Capacity) as the relative state of charge (RSOC; Relative State Of Charge).

Concretely, the relative state of charge (RSOC) is calculated from numerical formula 1, by using the charge capacity (CC) as the remaining capacity (RC) at the charging time, or a capacity (FCC−DCC) as the remaining capacity (RC) left by subtracting the discharge capacity (DCC) from its full charge capacity (FCC) at the discharging time.
(Numerical formula 1)

$$RSOC = RC/FCC \qquad (1)$$

Further, the relative state of charge (RSOC) of secondary battery 11 obtained by remaining capacity calculating portion 15d is transmitted to electric device 20 through above-mentioned communication processing portion 17.

Fundamentally, in battery pack 10 having the above-mentioned configuration, feature of the present disclosure is described in the following. Regardless of the above-mentioned operation modes, the design capacity (DC; Design Capacity) and the full charge capacity (FCC) of secondary battery 11 are centrally managed, and the remaining capacity (RC) or the discharge capacity (DCC) is unambiguously obtained, and the relative state of charge (RSOC) of secondary battery 11 is calculated corresponding to the above-mentioned operation modes.

Figure 2:
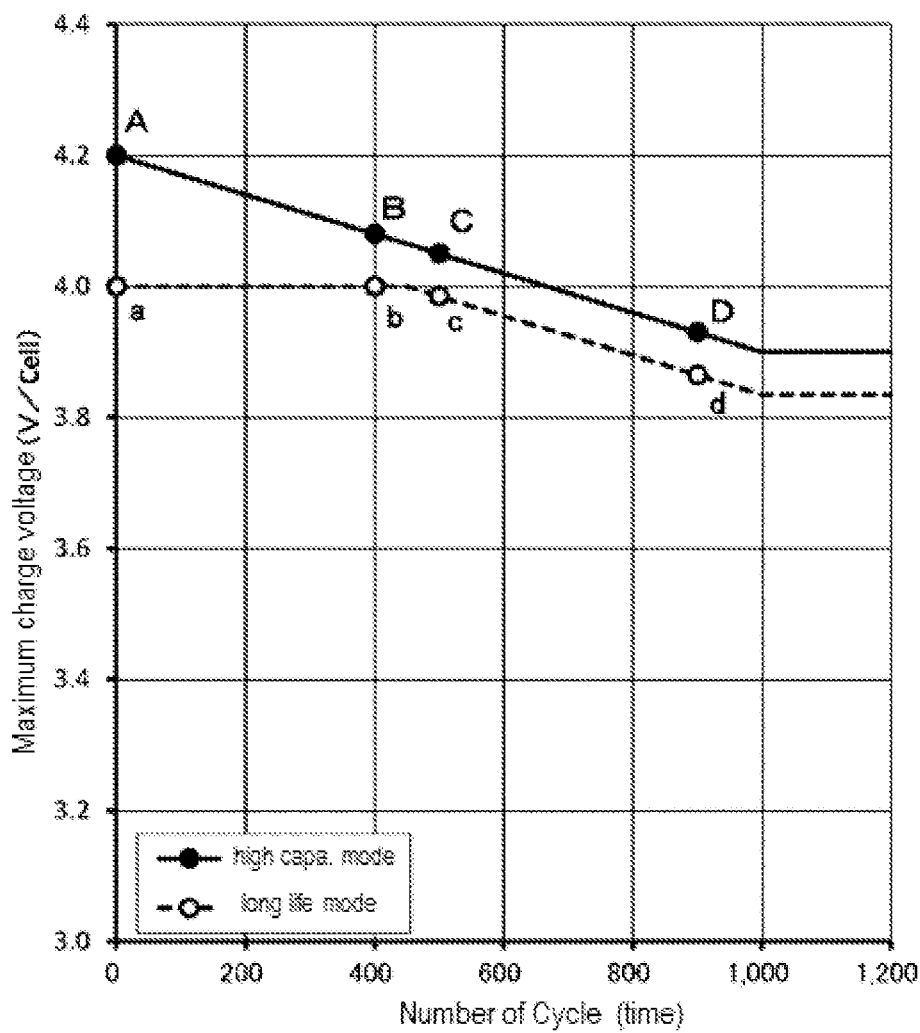
FIG. 2 is a figure showing a relation between cycle number of a secondary battery and charge end voltage of a high capacity mode or a long life mode in the battery pack of one embodiment of the present invention.

Next, FIG. 2 is a figure showing a relation between cycle number of the secondary battery and the charge end voltage of the high capacity mode or the long life mode in the battery pack of one embodiment of the present invention. The lateral axis shows the cycle number (cycle times), and the vertical axis shows the charge end voltage (V/cell) of the high capacity mode or the long life mode. Then, the solid line shows the high capacity mode, and the broken line shows the long cycle mode.

In the high capacity mode, as shown in FIG. 2, the charge end voltage is set at the first voltage (4.2 V/cell) in an early stage of the usage state of secondary battery 11 to charge. Then, as the cycle number of secondary battery 11 increases, it is controlled to gradually decrease the charge end voltage from the first voltage (for example, 4.2 V/cell). Thus, it is prevented that secondary battery 11 is further degraded by over-charge after secondary battery 11 is degraded due to large cycle number of secondary battery 11.

Figure 7:
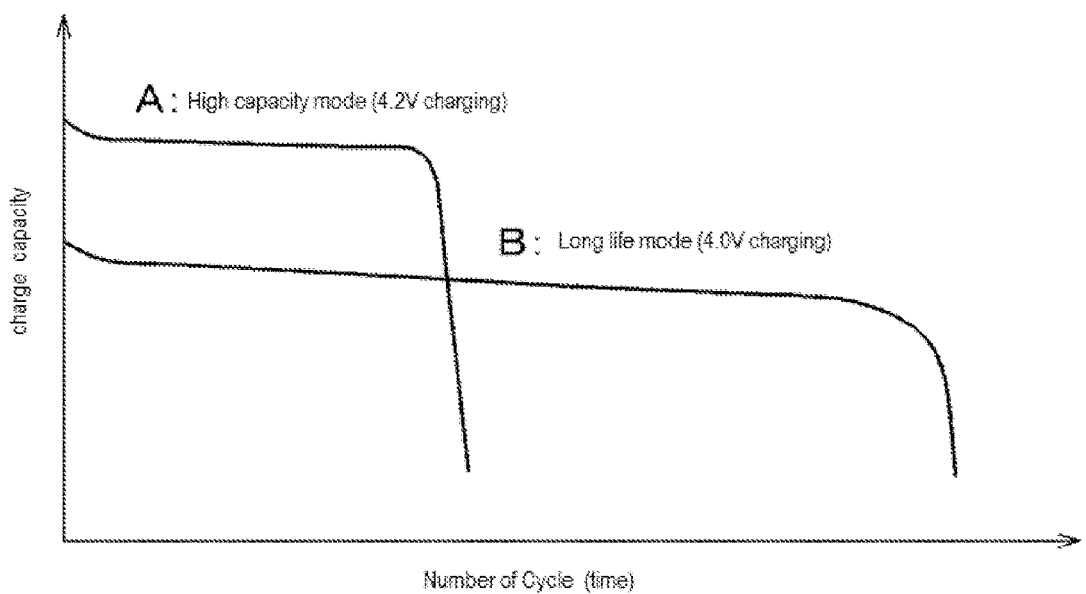
FIG. 7 is a figure showing charge capacity and cycle life of the secondary battery (the lithium ion battery) changing by charging voltage
Figure 8:
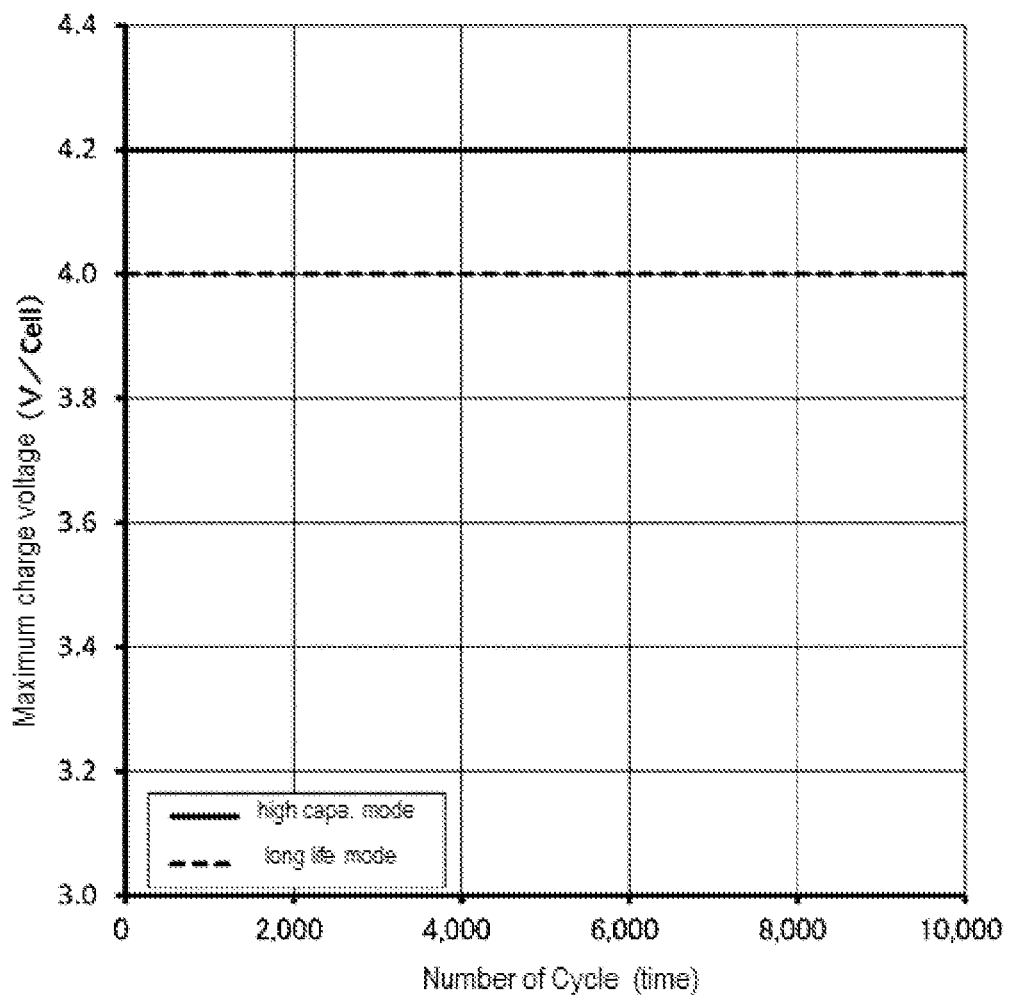
FIG. 8 is a figure showing a relation between cycle number of the secondary battery and charge end voltage of the high capacity mode or the long life mode in a conventional battery pack.

In the long life mode, as shown in FIG. 2, while the cycle number of the secondary battery 11 is small, the charge end voltage is set at the second voltage (for example, 4.0 V/cell) lower than the first voltage (4.2 V/cell) such that the capacity of secondary battery 11 becomes a predetermined ratio (for example, 80%) to the design capacity. Thus, a certain degree of the capacity of secondary battery 11 can be kept, and as secondary battery 11 is not charged near the full charge, this mode has a life longer than the high capacity mode as shown in FIG. 7.

When the cycle number of secondary battery 11 is increased, the capacity of secondary battery 11 as 100% of the relative state of charge in the high capacity mode becomes close to the capacity of the predetermined ratio (for example, 80%) to the design capacity of secondary battery 11. Then, as shown in FIG. 2, the charge end voltage of the first voltage becomes close to the second voltage. For example, when the capacity of secondary battery 11 as 100% of the relative state of charge in the high capacity mode becomes the capacity of the predetermined ratio 85% to the design capacity of secondary battery 11, the controlling is carried out such that the charge end voltage in the long life mode is gradually decreased in the same way as the high capacity mode as the cycle number increases, as shown in FIG. 2.

In detail, as the cycle number increases, the first voltage as the charge end voltage in the high capacity mode becomes close to the second voltage (for example, 4.0 V/cell) as the charge end voltage in the long life mode. When a difference between the charge end voltage in the high capacity mode and the charge end voltage in the long life mode becomes a predetermined voltage or less, for example, 0.065V or less, the controlling is carried out such that the charge end voltage in the long life mode is gradually decreased in the same way as the high capacity mode as the cycle number increases, as shown in FIG. 2. For example, those are decreased in parallel like FIG. 2 as the predetermined voltage, for example, 0.065 V of the difference between the charge end voltage in the high capacity mode and the charge end voltage in the long life mode.

Further, when the cycle number becomes close to a predetermined cycle times, for example, 1000 cycles, the first voltage as the charge end voltage in the high capacity mode, is fixed at, for example, 3.9 V/cell, and the charge end voltage 3.9 V/cell is kept even though the cycle number increases after that.

Thus, it prevents an overturn of the charge end voltages in the high capacity mode and the long life mode, and as secondary battery 11 is not charged near the full charge in the long life mode, it is used in the long life even after the degradation of secondary battery 11.

Figure 3:
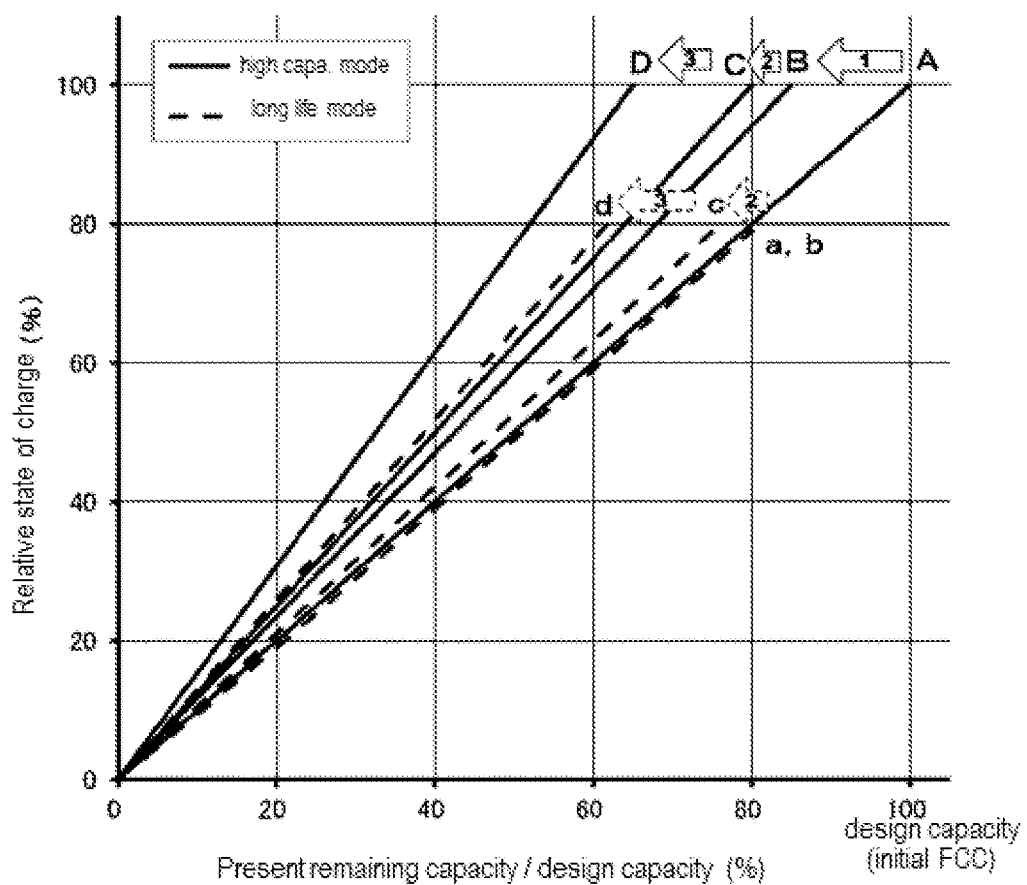
FIG. 3 is a figure showing change in capacities and relative states of charge in the high capacity mode or the long life mode of the battery pack of one embodiment of the present invention.

Next, FIG. 3 is a figure showing change in capacities and relative states of charge in the high capacity mode or the long life mode of the battery pack of the one embodiment of the present invention. The lateral axis shows the ratio (RC/FCC$_{int}$)(%) of the remaining capacity (RC) after cycles to the design capacity (initial FCC), and the vertical axis shows the relative state of charge (%) after cycles in the high capacity mode or the long life mode. Then, the solid line shows the high capacity mode, and the broken line shows the long cycle mode.

FIG. 3 shows a relation of capacities and relative states of charge in the high capacity mode or the long life mode in an initial state (A point) of secondary battery 11 and three states (B, C, D point) where secondary batteries 11 are degraded after cycles. In a case where it is explained by using the full charge capacity, in secondary batteries 11 of the four states, the ratio of the full charge capacity to the design capacity is 100%, 85%, 80%, or 65%. The relations in the high capacity mode are shown by solid lines linking A, B, C, D points of such percentage states and the 0 point, and the relations in the long life mode are shown by broken lines linking a, b, c, d points of such percentage states and the 0 point. These points are shown by using the same marks (A to D points, a to d points). The relative state of charge in the high capacity mode (RSOC$_{HC}$) changes between 0% and 100%, the relative state of charge in the long life (RSOC$_{LL}$) changes between 0% and 80%.

(Numerical formula 2)

$$0\% \leq RSOC_{HC} \leq 100\%$$

$$0\% \leq RSOC_{LL} \leq 80\% \quad (2)$$

Each of timing points is explained by FIG. 3.

In the A point and the a point of FIG. 3 as the initial state of secondary battery 11, the relative state of charge in the high capacity mode (RSOC$_{HG}$) and the relative state of charge in the long life (RSOC$_{LL}$) are equal to the ratio (RC/FCC$_{int}$) of the remaining capacity to the design capacity of secondary battery 11.

(Numerical formula 3)

$$RSOC_{HC} = RSOC_{LL} = RC/FCC_{int} \quad (3)$$

Next, as the cycle number proceeds and the degradation of secondary battery 1 proceeds, the full charge capacity of secondary battery 11 is gradually decreased as shown by arrow 1 in the high capacity mode. For example, at the B or b point of FIG. 3 where the ratio of the remaining capacity to the design capacity of secondary battery 11 becomes 85%, 85% in the relative state of charge in the high capacity mode (RSOC$_{HC}$) is the ratio (RC/FCC$_{int}$) of the remaining capacity to the design capacity of secondary battery 11. As the charge end voltage in the long life mode is kept at 4.0 V which is the same value as the initial state of secondary battery 11 as shown in FIG. 2, the relative state of charge in the long life (RSOC$_{LL}$) is equal to the ratio (RC/FCC$_{int}$) of the remaining capacity to the design capacity of secondary battery 11 of the same value as the initial state of secondary battery 11.

(Numerical formula 4)

$$RSOC_{HC} \times 0.85 = RSOC_{LL} = RC/FCC_{int} \quad (4)$$

From the above-mentioned two timing points, the relative state of charge in the high capacity mode and the relative state of charge in the long life are calculated based on different numerical formulas from the initial state of secondary battery 11 to about 80% (for example, 83%) in the ratio of the remaining capacity to the design capacity of secondary battery 11 (x is a factor).

(Numerical formula 5)

$$RSOC_{HC} \times x = RSOC_{LL} = RC/FCC_{int} \quad (5)$$

$$0.80 < x \leq 1.0$$

As the degradation of secondary battery 11 proceeds, when a difference between the full charge capacity of the secondary battery in the high capacity mode and the remaining capacity in the ratio 80% of the remaining capacity to the design capacity in the long life mode becomes a predetermined value or less as shown in arrow 2, the charge end voltage in the long life mode is decreased in the same way as the high capacity mode as shown in FIG. 2. For example, at the C or c point of the degraded state in the ratio 80% of the remaining capacity to the design capacity in the long life mode, 80% in the relative state of charge in the high capacity mode (RSOC$_{HC}$) is the ratio (RC/FCC$_{int}$) of the remaining capacity to the design capacity of secondary battery 11. 94% (=75/80) in the relative state of charge in the long life (RSOC$_{LL}$) is the ratio (RC/FCC$_{int}$) of the remaining capacity to the design capacity of secondary battery 11.

(Numerical formula 6)

$$RSOC_{HC} \times 0.80 = RSOC_{LL} \times 0.94 = RC/FCC_{int} \quad (6)$$

When the degradation of secondary battery 11 proceeds as shown in arrow 3, for example, at the D or d point in FIG. 3 of the degraded state in the ratio 65% of the remaining capacity to the design capacity in the high capacity mode, 65% in the relative state of charge in the high capacity mode (RSOC$_{HC}$) is the ratio (RC/FCC$_{int}$) of the remaining capacity to the design capacity of secondary battery 11. 78% (=62/80) of the relative state of charge in the long life (RSOC$_{LL}$) is the ratio (RC/FCC$_{int}$) of the remaining capacity to the design capacity of secondary battery 11.

(Numerical formula 7)

$$RSOC_{HC} \times 0.65 = RSOC_{LL} \times 0.78 = RC/FCC_{int} \quad (7)$$

When the remaining capacity of secondary battery 11 is equal to or less than about 80% (for example, 85%) in the design capacity, the relative state of charge in the high capacity mode and the relative state of charge in the long life mode are calculated by the following numerical formula (y, or z is a factor).

(Numerical formula 8)

$$RSOC_{HC} \times y = RSOC_{LL} \times x = RC/FCC_{int} \quad (8)$$

Lastly, the relative state of charge by switching the operation modes of the long life mode and the high capacity mode is explained.

When the switching of the operation modes is carried out during charging and discharging, remaining capacity calculating portion 15d calculates the relative state of charge according to the properties of the relative state of charge to the ratio of the remaining capacity to the design capacity of secondary battery 11 in the operation mode before the switching. Then, after the charge end voltage is reached in the operation mode after the switching, remaining capacity calculating portion 15d calculates the relative state of charge according to the properties of the relative state of charge to the ratio of the remaining capacity to the design capacity of secondary battery 11 in the operation mode after the switching.

Figure 4:
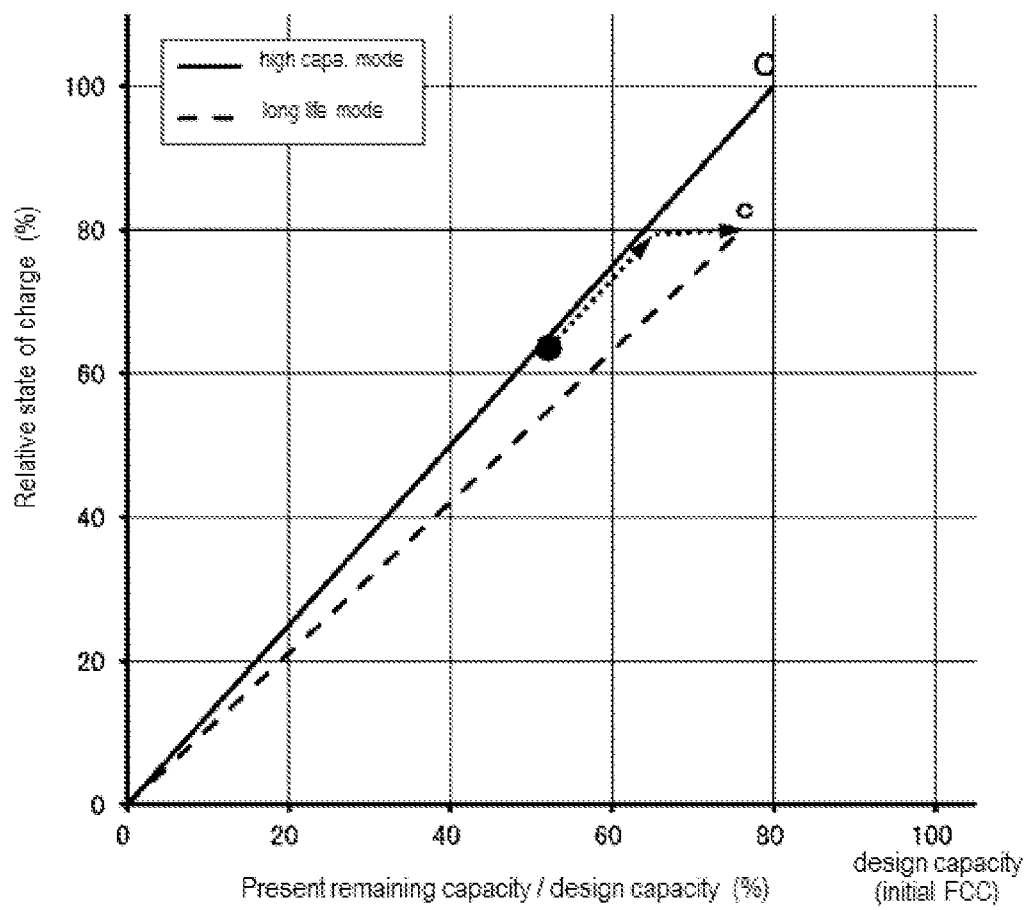
FIG. 4 is a figure showing change in the relative state of charge at a time of switching from the high capacity mode to the long life mode of the battery pack of one embodiment of the present invention.
Figure 5:
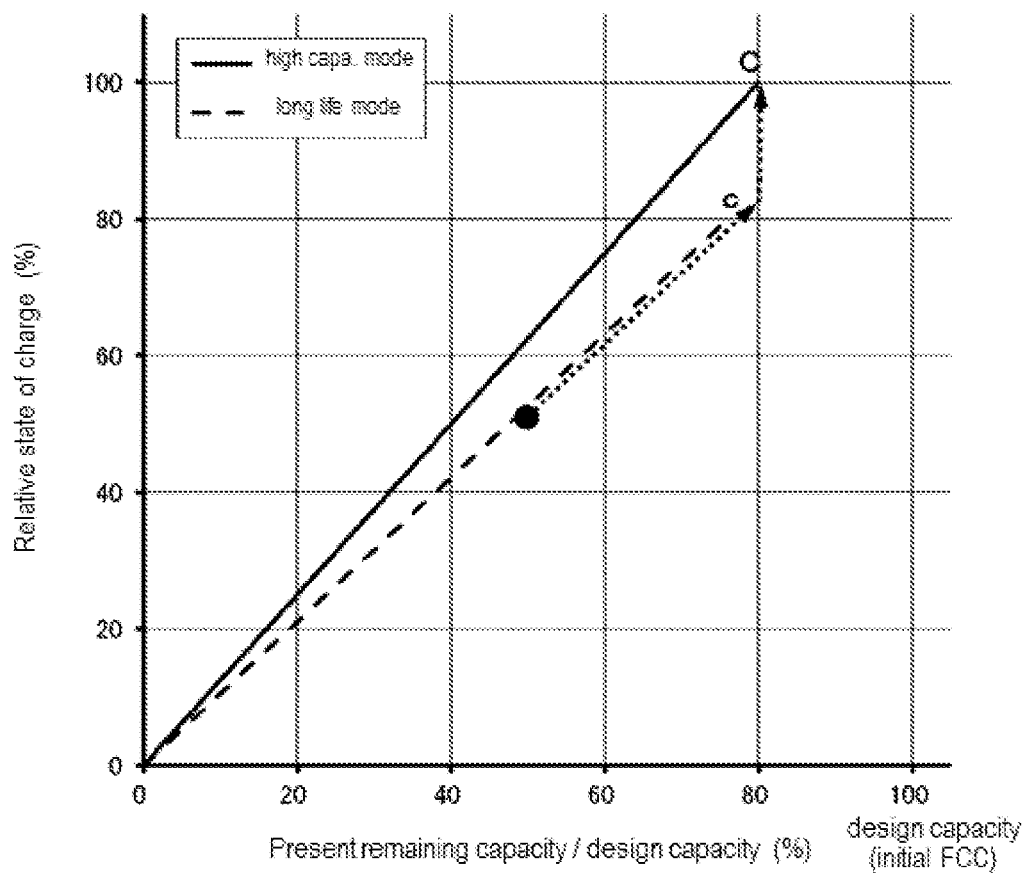
FIG. 5 is a figure showing change in the relative state of charge at a time of switching from the long life mode to the high capacity mode of the battery pack of one embodiment of the present invention.

The change of the relative state of charge right after the switching of the operation mode, is explained as one example in a case where the operation modes are switched at the timing point of the C point. FIG. 4 is a figure showing change in the relative state of charge at a time of switching from the high capacity mode to the long life mode of the battery pack of one embodiment of the present invention. FIG. 5 is a figure showing change in the relative state of charge at a time of switching from the long life mode to the high capacity mode of the battery pack of one embodiment of the present invention.

In FIG. 4, the operation mode is charged from the high capacity mode to the high capacity mode at the point of the black circle, and charging is carried out. Since right after the switching of the operation mode, the relative state of charge follows according to the properties of the relative state of charge to the ratio of the remaining capacity to the design capacity of secondary battery 11 in the high capacity mode before the switching, the relative state of charge is increased as shown by the arrow of the broken line along the linear line linking the 0 point and the C point. When the relative state of charge becomes 80%, the relative state of charge is kept at 80% as the maximum relative state of charge in the long life mode after the switching as shown by the arrow of the broken line which is bent in the lateral axis direction until it becomes the charge end voltage, and charging is terminated. Alternatively, the relative state of charge is kept at 79%, and after the charge end voltage is reached, the relative state of charge is changed to 80%, and charging is terminated.

When the charge end voltage is reached at the c point of FIG. 4, remaining capacity calculating portion 15d sets the relative state of charge to the ratio of the remaining capacity to the design capacity of secondary battery 11 as 80%. Until the operation mode is switched next time, remaining capacity calculating portion 15d calculates the properties of the relative state of charge to the ratio of the remaining capacity to the design capacity of secondary battery 11 along the linear line linking the 0 point and the c point.

In FIG. 5, the operation mode is charged from the long life mode to the high capacity mode at the point of the black circle, and charging is carried out. Since right after the switching of the operation mode, the relative state of charge follows according to the properties of the relative state of charge to the ratio of the remaining capacity to the design capacity of secondary battery 11 in the long life mode before the switching, the relative state of charge is varied as shown by the arrow of the broken line along the linear line linking the 0 point and the c point. Even after the relative state of charge becomes 80%, the relative state of charge is changed on the extension line of the linear line linking the 0 point and the c point. Then, after the charge end voltage is reached, the relative state of charge is sharply increased to 100%, and charging is terminated.

When he charge end voltage is reached at the C point of FIG. 5, remaining capacity calculating portion 15d sets the relative state of charge to the ratio of the remaining capacity to the design capacity of secondary battery 11 as 100%. Until the operation mode is switched next time, remaining capacity calculating portion 15d calculates the properties of the relative state of charge to the ratio of the remaining capacity to the design capacity of secondary battery 11 along the linear line linking the 0 point and the C point.

From these, even though the operation mode is changed from the high capacity mode to the long life mode, or from the long life mode to the high capacity mode, the relative state of charge is kept at 80%, or sharply increased from near 80% to 100% only at the time when the vicinity of the full charge is firstly reached right after the switching, but the relative state of charge is appropriately indicated at the timing points of the small remaining capacity which is needed to pay attention to the charging state.

The timing point of the C point of FIG. 3 is explained as the one example, but when the properties in the high capacity mode and the long life mode are different at timing points of the B, C, D point or other points, the same processing is carried out at the time of switching the operation modes.

From these configuration, while it is suppressed that the secondary battery used selectively in the high capacity mode or the long life mode is degraded by over-charge, the relative state of charge of the secondary battery is appropriately obtained corresponding to the operation mode (charging mode), or even at a time of changing the operation modes.

Figure 6:
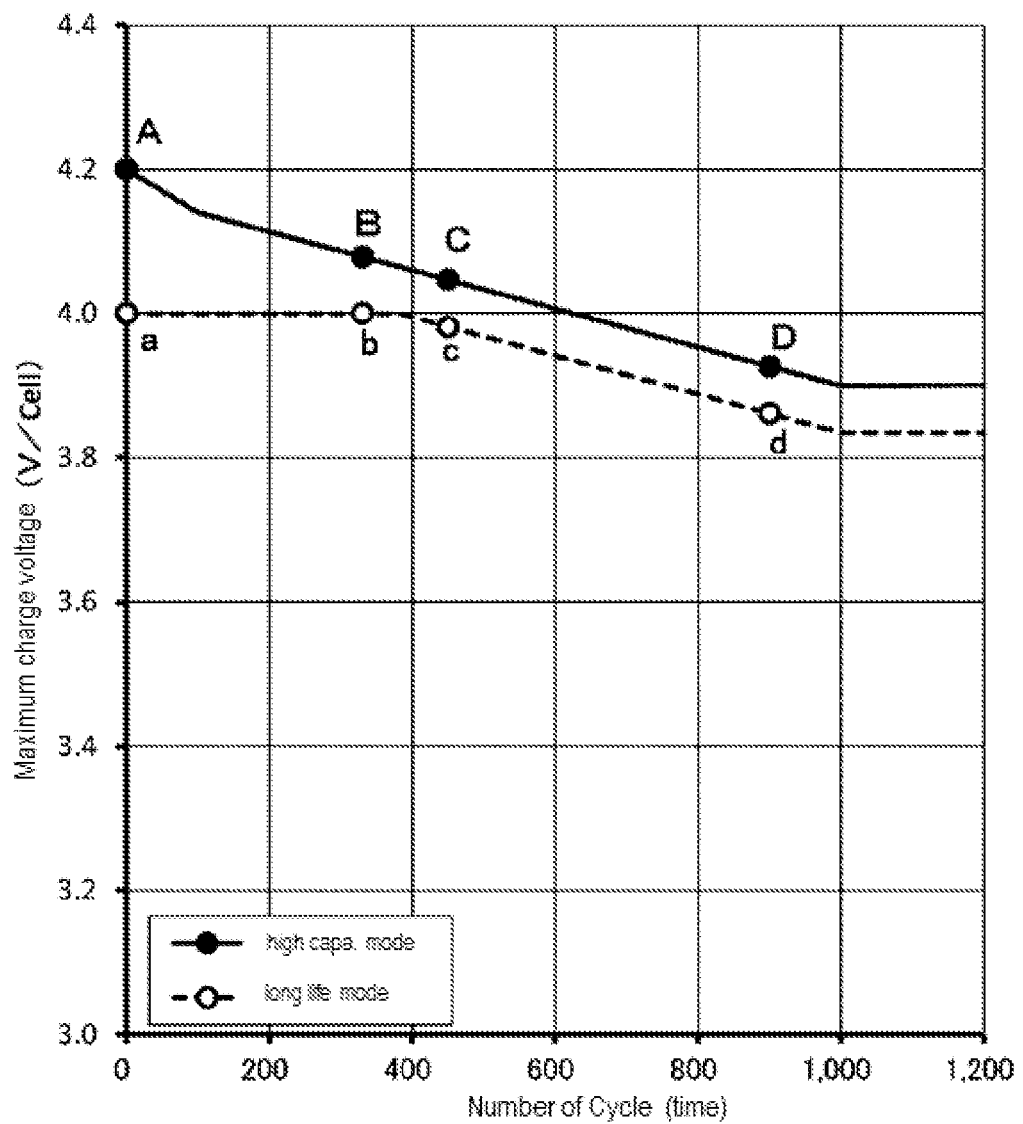
FIG. 6 is a figure showing a relation between the cycle number of the secondary battery and the charge end voltage of the high capacity mode or the long life mode in the battery pack of another embodiment of the present invention.

Here, in the embodiment, the charge end voltage is decreased linearly corresponding to the cycle number shown in FIG. 2, but may be decreased in a curved line. Further, it may be decreased in step form. The charge end voltage may be decreased in different linear or curved lines at early, middle, or last stages to meet the properties of the using battery. Especially, as shown in FIG. 6, the charge end voltage is largely decreased from the early stage to 100-200 cycles, and then the degradation of the secondary battery is suppressed after that.

In the embodiment, as shown in FIG. 2, the charge end voltage is decreased to the cycle number, but the charge end voltage may be decreased to lapsed days. In this case, the charge end voltage is decreased according to day information inputted from the electric device. Further, the charge end voltage may be decreased to the cycle number in the first half of the usage period, and the charge end voltage may be decreased to the usage days in the second half of the usage period. By this, the degradation by the frequency of use is handled with the cycle number of the secondary batter in the first half of the usage period, and regardless of really using the battery, the degradation by the lapsed days is handed in the second half of the usage period.

Here, in the embodiment, the first voltage of the high capacity mode in the secondary battery at early stage is set at the maximum full charge capacity of 4.2 V in the secondary battery, but the first voltage is set at 4.05 to 4.19 V/cell higher than the second voltage, and the full charge capacity can be set at 85 to 99% in the maximum full charge capacity. By this, as charging is not carried out around the full charge even in the high capacity mode, the degradation can be reduced.

INDUSTRIAL APPLICABILITY

In the battery pack related to the embodiment of the present invention, while it is suppressed that the secondary battery used selectively at the high capacity mode or the long life mode is degraded by over-charge, the relative state of charge of the secondary battery is appropriately obtained corresponding to the operation mode, or even at a time of changing the operation modes. Therefore, this is useful as the battery pack or the battery system which changes the operation mode.

The invention claimed is:

1. A battery pack comprising:
   a secondary battery; and
   a controlling and computing portion for controlling a charging and a discharging of the secondary battery,
   wherein the controlling and computing portion includes:
      an operation mode setting portion for selectively setting a high capacity mode or a long life mode, the high capacity mode restricting a charge end voltage of the secondary battery within a first voltage, the long life mode restricting the charge end voltage of the secondary battery within a second voltage lower than the first voltage to increase a cycle life of the secondary battery;
      a remaining capacity calculating portion for calculating a relative state of charge from a remaining capacity and a full charge capacity, the remaining capacity calculated based on a discharging current and a discharging time of the secondary battery, or the discharging current and a battery voltage;
      a cycle number calculating portion for calculating a cycle number from a calculation result of the remaining capacity calculating portion; and
      a charge end voltage setting portion for decreasing the first voltage based on the cycle number, and setting the second voltage at a voltage left by subtracting a predetermined voltage from the first voltage in a case where the first voltage becomes equal to or less than a voltage obtained by adding a predetermined value to the second voltage,
   wherein in the remaining capacity calculating portion,
   when the high capacity mode is set, a design capacity of the secondary battery or a charge capacity at the charge end voltage is used as the full charge capacity,
   when the long life mode is set and the first voltage is more than the voltage obtained by adding the predetermined value to the second voltage, a capacity of the design capacity multiplied by a predetermined factor of 100% or less is used as a maximum charge capacity, and
   when the long life mode is set and the first voltage is equal to or less than the voltage obtained by adding the predetermined value to the second voltage, a charge capacity at the second voltage is used as the maximum charge capacity.

2. The battery pack according to claim 1,
   wherein immediately after a change of an operation mode, the remaining capacity calculating portion calculates the relative state of charge by a calculation method used in the operation mode before the change, and after a voltage reaches the charge end voltage by a charging in the operation mode after the change, the remaining capacity calculating portion calculates the relative state of charge by a calculation method used in the operation mode after the change.

3. The battery pack according to claim 2,
   wherein the remaining capacity calculating portion calculates the relative state of charge with a maximum value restricted to the predetermined factor when a charging is done in a vicinity of a first time full charge after the operation mode is changed from the high capacity mode to the long life mode.

4. The battery pack according to claim 2,
   wherein the remaining capacity calculating portion changes the relative state of charge to 100% when a charging is done in a vicinity of a first time full charge after the operation mode is changed from the long life mode to the high capacity mode.

5. The battery pack according to claim 1,
   wherein the remaining capacity calculating portion calculates the full charge capacity as the relative state of charge of 100% in the high capacity mode, and the remaining capacity calculating portion calculates the maximum charge capacity as the predetermined factor of the relative state of charge.

6. The battery pack according to claim 1,
   wherein the secondary battery is a lithium ion battery,
   in the high capacity mode, the first voltage restricting the charge end voltage is set at 4.2 V/cell in an early stage of a usage state of the secondary battery,
   in the long life mode, the second voltage restricting the charge end voltage is set at 3.9 to 4.1 V/cell.

* * * * *